(12) United States Patent
Watanabe et al.

(10) Patent No.: US 11,646,208 B2
(45) Date of Patent: May 9, 2023

(54) METHOD FOR MANUFACTURING SEMICONDUCTOR DEVICE

(71) Applicant: DENSO CORPORATION, Kariya (JP)

(72) Inventors: Masakazu Watanabe, Toyota (JP); Shuhei Eguchi, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/678,150

(22) Filed: Feb. 23, 2022

(65) Prior Publication Data

US 2022/0181164 A1    Jun. 9, 2022

Related U.S. Application Data

(63) Continuation of application No. PCT/JP2020/003956, filed on Feb. 3, 2020.

(30) Foreign Application Priority Data

Aug. 27, 2019    (JP) .............................. JP2019-154920

(51) Int. Cl.
*H01L 21/38*    (2006.01)
*H01L 21/385*    (2006.01)
*H01L 21/477*    (2006.01)

(52) U.S. Cl.
CPC .......... *H01L 21/385* (2013.01); *H01L 21/477* (2013.01)

(58) Field of Classification Search
CPC ..... H01L 21/477; H01L 21/385; H01L 21/22; H01L 21/2225; H01L 21/223; H01L 21/225; H01L 21/2251; H01L 21/228; H01L 21/2233; H01L 21/383; H01L 21/388; H01L 21/02216
USPC ........................................................ 438/104
See application file for complete search history.

(56) References Cited

U.S. PATENT DOCUMENTS

| 2005/0051793 A1 | 3/2005 | Ishida et al. |
| 2019/0115434 A1 | 4/2019 | Sakumoto et al. |
| 2019/0288115 A1 | 9/2019 | Goto et al. |
| 2019/0319131 A1 | 10/2019 | Uraoka et al. |

FOREIGN PATENT DOCUMENTS

JP    2014-033089 A    2/2014
WO    WO-2014196253 A1 *    12/2014    ......... H01L 21/2225

\* cited by examiner

*Primary Examiner* — Tucker J Wright
*Assistant Examiner* — Azm A Parvez
(74) *Attorney, Agent, or Firm* — Posz Law Group, PLC

(57) ABSTRACT

A method for manufacturing a semiconductor device is provided. The method includes forming an organosilicon compound layer on a surface of an oxide semiconductor substrate, heating the oxide semiconductor substrate provided with the organosilicon compound layer at a first temperature to form a silicon diffusion layer inside the oxide semiconductor substrate, and removing the organosilicon compound layer from the surface of the oxide semiconductor substrate after heating the oxide semiconductor substrate at the first temperature.

8 Claims, 4 Drawing Sheets

METHOD FOR MANUFACTURING SEMICONDUCTOR DEVICE

CROSS REFERENCE TO RELATED APPLICATION

The present application is a continuation application of International Patent Application No. PCT/JP2020/003956 filed on Feb. 3, 2020, which designated the U.S. and claims the benefit of priority from Japanese Patent Application No. 2019-154920 filed on Aug. 27, 2019. The entire disclosures of all of the above applications are incorporated herein by reference.

TECHNICAL FIELD

The present disclosure relates to a method for manufacturing a semiconductor device.

BACKGROUND

In a manufacturing process of a semiconductor device having an oxide semiconductor substrate, a silicon diffusion layer may be formed inside the oxide semiconductor substrate.

SUMMARY

A method for manufacturing a semiconductor device includes forming an organosilicon compound layer on a surface of an oxide semiconductor substrate, heating the oxide semiconductor substrate provided with the organosilicon compound layer at a first temperature to form a silicon diffusion layer inside the oxide semiconductor substrate, and removing the organosilicon compound layer from the surface of the oxide semiconductor substrate after heating the oxide semiconductor substrate at the first temperature.

DESCRIPTION OF EMBODIMENTS

Figure 1:
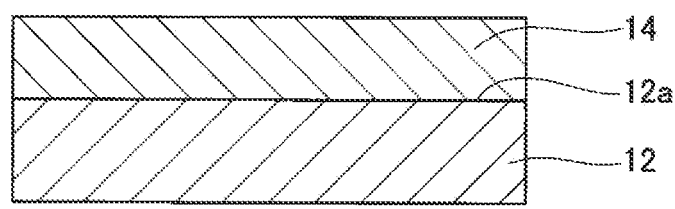
FIG. 1 is a view for explaining a manufacturing method of the first embodiment.

To begin with, examples of relevant techniques will be described.

In a manufacturing process of a semiconductor device having an oxide semiconductor substrate, a silicon diffusion layer may be formed inside the oxide semiconductor substrate. For example, a silicon diffusion layer is formed to form an n-type region inside the oxide semiconductor substrate. Usually, the silicon diffusion layer is formed by silicone ion-implantation into the oxide semiconductor layer. When silicon is implemented into the oxide semiconductor substrate, crystal defects are generated inside the oxide semiconductor substrate. Even if the oxide semiconductor substrate is heated, crystal defects are hardly recovered in the oxide semiconductor substrate. Therefore, a highly crystalline silicon diffusion layer cannot be obtained by this method.

A technique for forming a silicon diffusion layer inside a gallium nitride substrate by solid phase diffusion has been known. In this technique, a dope material made of silicon is formed on the surface of the gallium nitride substrate. Then, the gallium nitride substrate is heated to diffuse silicon from the dope material into the gallium nitride substrate. After that, the dope material is removed. According to this method, a silicon diffusion layer having few crystal defects can be formed inside the gallium nitride substrate.

The inventors of the present application have conducted an experiment to form a silicon diffusion layer inside an oxide semiconductor substrate by applying the above-described technique. In this experiment, the following process was performed. First, a dope material made of silicon is formed on the surface of an oxide semiconductor substrate. Then, the oxide semiconductor substrate is heated to diffuse silicon from the dope material into the oxide semiconductor substrate. After that, the dope material is removed by etching.

However, this method has been found to cause the following problems. When the oxide semiconductor substrate is heated to a high temperature (for example, 950° C. or higher) after forming the dope material, the dope material (i.e., silicon) reacts with oxygen in the oxide semiconductor substrate and the oxide semiconductor substrate is eroded. Therefore, the oxide semiconductor substrate cannot be heated to such a high temperature. When the oxide semiconductor substrate is heated at a low temperature (for example, 900° C. or lower), the distance in which the silicon diffuses into the oxide semiconductor substrate from the dope material is extremely short, and the thickness of the silicon diffusion layer formed in the oxide semiconductor substrate is thin. After that, the dope material is removed by etching. At this time, a portion of the oxide semiconductor substrate below the dope material (i.e., the portion where the silicon diffusion layer is formed) is also etched. If the thickness of the silicon diffusion layer is thin, the entire silicon diffusion layer is removed in removing the dope material by etching, and the silicon diffusion layer cannot remain in the oxide semiconductor substrate. Therefore, it is difficult to form a silicon diffusion layer inside the oxide semiconductor substrate by the method using a silicon dope material.

This specification proposes a technique for forming a highly crystalline silicon diffusion layer inside an oxide semiconductor substrate.

A method for manufacturing a semiconductor device disclosed in the present specification includes forming an organosilicon compound layer on a surface of an oxide semiconductor substrate, heating the oxide semiconductor substrate provided with the organosilicon compound layer at a first temperature to form a silicon diffusion layer inside the oxide semiconductor substrate, and removing the organosilicon compound layer from the surface of the oxide semiconductor substrate after heating the oxide semiconductor substrate at the first temperature.

In this method, the oxide semiconductor substrate is heated after the organosilicon compound layer is formed on the surface of the oxide semiconductor substrate. Then, silicon diffuses from the organosilicon compound into the oxide semiconductor substrate, so that a silicon diffusion layer is formed inside the oxide semiconductor substrate. After that, the organosilicon compound layer is removed. The organosilicon compound layer can be removed from the surface of the oxide semiconductor substrate by various methods such as washing by using an organic solvent and ashing. According to such method, the organosilicon compound layer can be removed with almost no erosion of the oxide semiconductor substrate. Therefore, after the removal of the organosilicon compound, the silicon diffusion layer remains inside the oxide semiconductor substrate. As described above, according to this method, the silicon diffusion layer can be formed in the oxide semiconductor substrate. Further, in this method, since crystal defects are less likely to be formed in the oxide semiconductor substrate, a silicon diffusion layer having high crystallinity can be formed in the oxide semiconductor substrate.

First Embodiment

In a manufacturing method of the first embodiment, first, as shown in FIG. 1, a polyorganosiloxane layer 14 is formed on the surface 12a of a gallium oxide substrate 12. The gallium oxide substrate 12 is made of gallium oxide ($Ga_2O_3$). The gallium oxide substrate 12 is one example of an oxide semiconductor substrate. Polyorganosiloxane is one example of an organosilicon compound. Polyorganosiloxane has adhesiveness. Therefore, for example, by attaching an adhesive tape having polyorganosiloxane as an adhesive to the surface 12a of the gallium oxide substrate 12, the polyorganosiloxane layer 14 can be formed on the surface 12a of the gallium oxide substrate 12.

Figure 2:
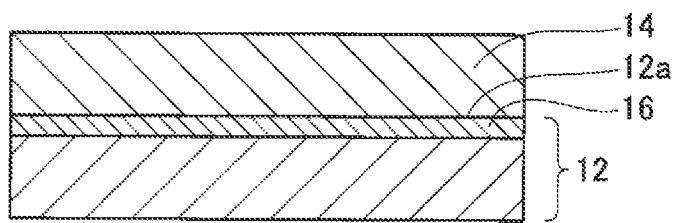
FIG. 2 is a view for explaining the manufacturing method of the first embodiment.

Next, the first heating step is carried out. In the first heating step, the gallium oxide substrate 12 having the polyorganosiloxane layer 14 on the surface 12a is heated. Here, the gallium oxide substrate 12 is heated to the temperature lower than the heat-resistance temperature of the polyorganosiloxane layer 14. For example, the gallium oxide substrate 12 is kept at 150° C. for 1 hour using a hot plate or the like. When the gallium oxide substrate 12 and the polyorganosiloxane layer 14 are heated as described above, the silicon (i.e., silicon atoms) in the polyorganosiloxane layer 14 diffuses into the gallium oxide substrate 12 (i.e., solid phase diffusion). As a result, as shown in FIG. 2, a silicon diffusion layer 16 is formed inside the gallium oxide substrate 12 near the polyorganosiloxane layer 14 (i.e, near the surface 12a). In the first heating step, since the heating temperature is low, the diffusion distance of silicon from the polyorganosiloxane layer 14 into the gallium oxide substrate 12 is short. Therefore, at this stage, the thickness of the silicon diffusion layer 16 is extremely thin.

Figure 3:
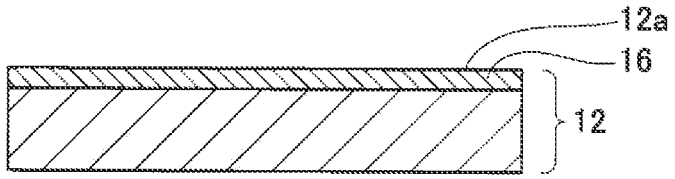
FIG. 3 is a view for explaining a manufacturing method of the first embodiment.

Next, as shown in FIG. 3, the polyorganosiloxane layer 14 is removed from the surface 12a of the gallium oxide substrate 12. Here, the polyorganosiloxane layer 14 is removed by washing by using an organic solvent. For example, when the polyorganosiloxane layer 14 is formed by an adhesive of an adhesive tape, the adhesive tape is peeled off from the gallium oxide substrate 12, and then the surface 12a is washed with an organic solvent. As the organic solvent, for example, n-butyl acetate can be used. By using an organic solvent, the polyorganosiloxane layer 14 can be easily removed from the surface 12a of the gallium oxide substrate 12. By removing the polyorganosiloxane layer 14, the surface 12a of the gallium oxide substrate 12 is exposed as shown in FIG. 3. Since the organic solvent does not erode the gallium oxide substrate 12, the silicon diffusion layer 16 remains on the surface 12a of the gallium oxide substrate 12.

Figure 4:
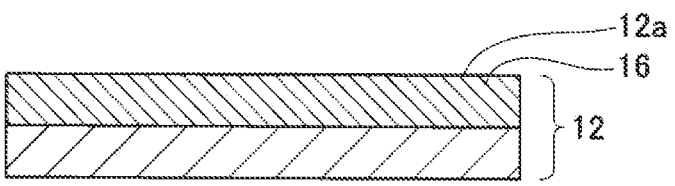
FIG. 4 is a view for explaining the manufacturing method of the first embodiment.

Next, the second heating step is performed. In the second heating step, the gallium oxide substrate 12 is heated to the temperature higher than that in the first heating step. Here, the gallium oxide substrate 12 is heated to the temperature equal to or higher than the heat-resistance temperature of the polyorganosiloxane layer 14. For example, the gallium oxide substrate 12 is kept at 600° C. or higher for 30 minutes using a diffusion furnace or the like. In the second heating step, since the polyorganosiloxane layer 14 does not exist on the surface 12a of the gallium oxide substrate 12, there is no particular problem even if the gallium oxide substrate 12 is heated to the temperature equal to or higher than the heat-resistance temperature of the polyorganosiloxane layer 14. Further, when the gallium oxide substrate 12 is heated to such a high temperature as described above, the silicon (i.e., silicon atoms) in the silicon diffusion layer 16 diffuses in the gallium oxide substrate 12. As a result, as shown in FIG. 4, the thickness of the silicon diffusion layer 16 increases. Further, when the gallium oxide substrate 12 is heated to a high temperature in the second heating step, the silicon in the gallium oxide substrate 12 is activated. The activated silicon functions as an n-type impurity in gallium oxide. Therefore, the silicon diffusion layer 16 becomes an n-type region.

After that, by performing various processing on the gallium oxide substrate 12, the semiconductor device can be manufactured. For example, an electrode may be formed on the surface 12a of the gallium oxide substrate 12 to make an ohmic contact between the electrode and the silicon diffusion layer 16.

Figure 5:
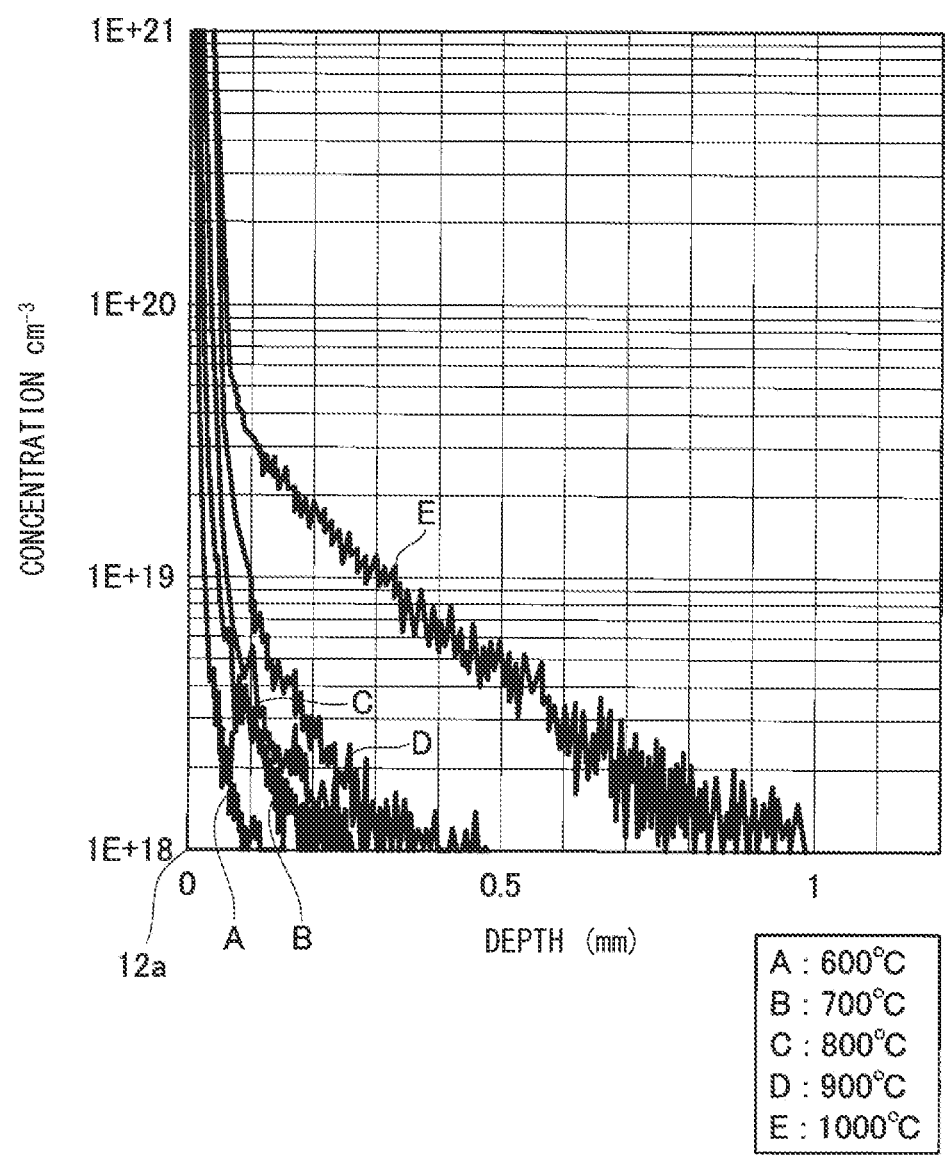
FIG. 5 is a graph indicating a concentration distribution of silicon in a silicon diffusion layer formed by the manufacturing method of the first embodiment.

As described above, according to the method of the first embodiment, the n-type silicon diffusion layer 16 can be formed in the gallium oxide substrate 12. FIG. 5 shows the concentration distribution of silicon in the silicon diffusion layer 16 after the second heating step is performed. The horizontal axis of FIG. 5 indicates the depth from the surface 12a, and the origin indicates the position of the surface 12a. FIG. 5 shows the concentration distribution of silicon for each temperature in the second heating step. As shown in FIG. 5, the concentration of silicon at the surface 12a is $1 \times 10^{21}/cm^3$ or more regardless of the temperature of the second heating step. When the concentration at the surface 12a is $1 \times 10^{21}/cm^3$ or more, the electrode on the surface 12a can be in ohmic contact with the silicon diffusion layer 16. According to this method, the silicon diffusion layer 16 having a concentration high enough to allow ohmic contact can be formed. Further, as is clear from FIG. 5, the higher the heating temperature in the second heating step, the wider a range in which the silicon diffuses and the thicker the silicon diffusion layer 16. Thus, according to this method, the diffusion range of silicon can be controlled by the heating temperature of the second heating step. Further, according to the method of the first embodiment, the silicon diffusion layer 16 can be formed without ion-implantation. Therefore, the silicon diffusion layer 16 with few crystal defects can be formed.

Figure 6:
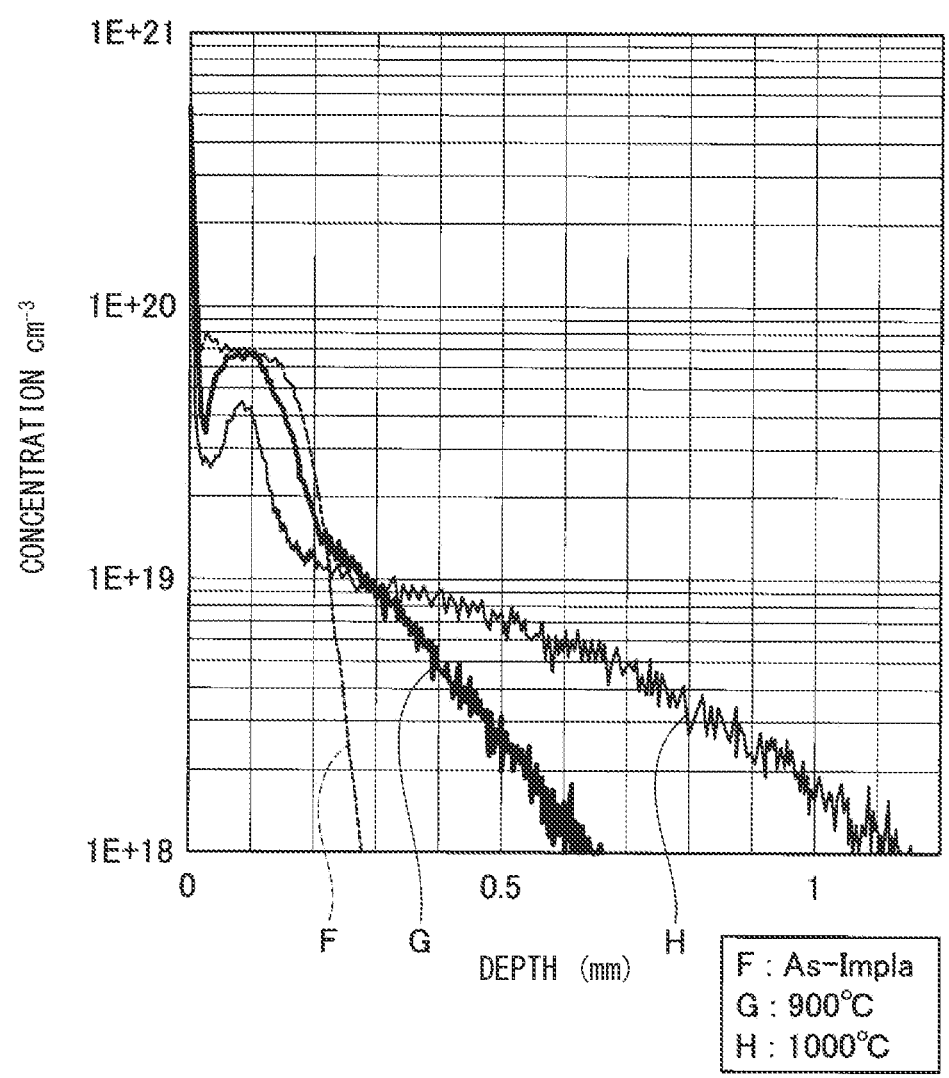
FIG. 6 is a graph indicating a concentration distribution of silicon in a silicon diffusion layer formed by ion-implantation.

FIG. 6 shows the concentration distribution of silicon in the silicon diffusion layer formed in the gallium oxide substrate by ion-implantation. In FIG. 6, the concentration distribution is shown for each of the case where the heat treatment is performed at 900° C. after an ion-implantation, the case where the ion implantation at 1000° C. is performed after the ion-implantation, and the case where the heat treatment is not performed (as-Impla). As shown in FIG. 6, in any case, the concentration of silicon on the surface 12a is lower than that of the silicon diffusion layer 16 (see FIG. 5) formed by the method of the first embodiment. In particular, the higher the heat treatment temperature, the lower the concentration of silicon on the surface 12a. One of the reasons for this is considered to be that the silicon diffusion layer formed by ion-implantation has a high crystal defect density, so that outward diffusion of silicon (diffusion outward of the gallium oxide substrate) is likely to occur. Another reason is that silicon is difficult to be activated due to the high crystal defect density. As described above, the method of the first embodiment allows to generate the silicon diffusion layer 16 having a higher concentration than that formed by ion-implantation.

Further, before and after forming the silicon diffusion layer 16 by the method of the first embodiment, the crystallinity of the gallium oxide substrate 12 was evaluated by RBS (Rutherford Backscattering Spectrometry). As a result, it was found that the crystallinity was higher after the silicon diffusion layer 16 was formed than before the silicon diffusion layer 16 was formed. This is because oxygen atoms forming the polyorganosiloxane diffuses from the polyorganosiloxane layer 14 into the gallium oxide substrate 12 in the first heating step. There are oxygen vacancies (defects in which oxygens do not exist at oxygen sites) in the gallium oxide substrate 12. The oxygen diffusing from the polyorganosiloxane layer 14 into the gallium oxide substrate 12 enters the oxygen vacancies, thereby reducing the crystal defects in the gallium oxide substrate 12 and improving the crystallinity of the gallium oxide substrate 12. As described above, according to the manufacturing method of the first embodiment, the silicon diffusion layer 16 having higher crystallinity can be formed.

The polyorganosiloxane layer 14 may be cured in the first heating step and it becomes difficult to remove the polyorganosiloxane layer 14 by using an organic solvent. In such case, the polyorganosiloxane layer 14 may be removed by ashing. By ashing, the polyorganosiloxane layer 14 can be removed with almost no erosion of the gallium oxide substrate 12.

Second Embodiment

In the second embodiment, the silicon diffusion layer 16 is formed only on a portion of the surface 12a of the gallium oxide substrate 12. Other configurations of the second embodiment are the same as those of the first embodiment.

Figure 7:
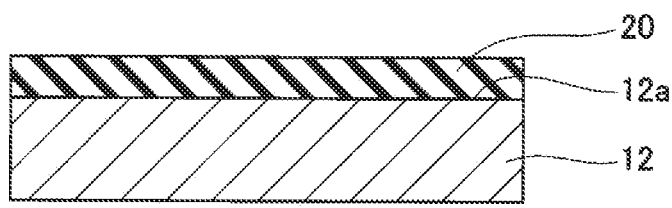
FIG. 7 is a view for explaining a manufacturing method of a second embodiment.
Figure 8:
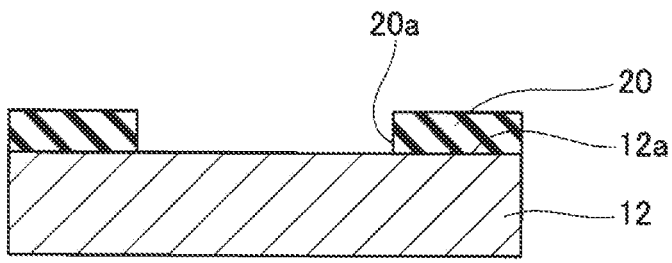
FIG. 8 is a view for explaining the manufacturing method of the second embodiment.
Figure 9:
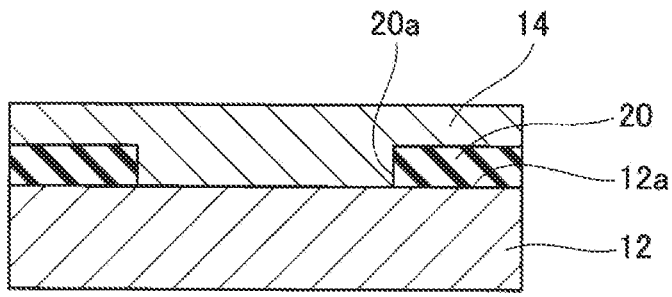
FIG. 9 is a view for explaining the manufacturing method of the second embodiment.

In the second embodiment, first, as shown in FIG. 7, a resist resin layer 20 is formed to cover the entire surface 12a of the gallium oxide substrate 12. Next, by patterning the resist resin layer 20 with photolithography, an opening 20a is defined in the resist resin layer 20 as shown in FIG. 8. Then, as shown in FIG. 9, the polyorganosiloxane layer 14 is formed to be in contact with the surface 12a through the opening 20a and the surface of the resist resin layer 20.

Figure 10:
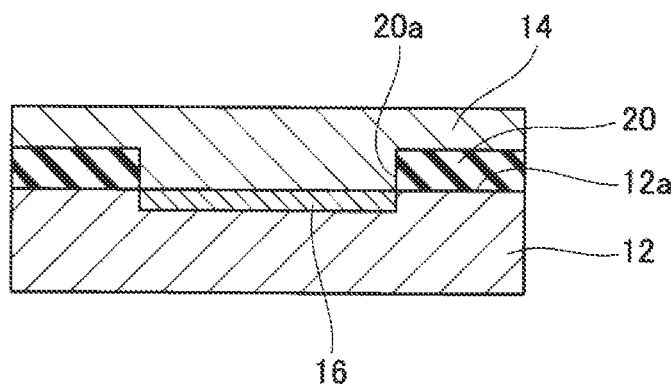
FIG. 10 is a view for explaining the manufacturing method of the second embodiment.

Next, the first heating step is performed. Then, in the opening 20a, silicon diffuses from the polyorganosiloxane layer 14 into the gallium oxide substrate 12. As a result, as shown in FIG. 10, the silicon diffusion layer 16 is formed inside the gallium oxide substrate 12 in the vicinity of the polyorganosiloxane layer 14 in the opening 20a. In the first heating step of the second embodiment, the gallium oxide substrate 12 is heated to a temperature lower than the heat-resistance temperature of the resist resin layer 20.

Figure 11:
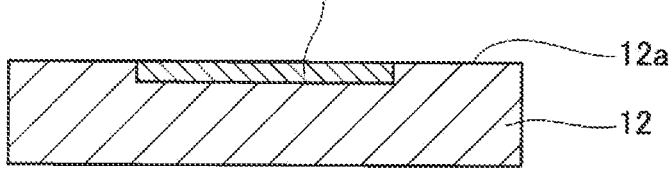
FIG. 11 is a view for explaining the manufacturing method of the second embodiment.

Next, as shown in FIG. 11, the polyorganosiloxane layer 14 and the resist resin layer 20 are removed from the surface 12a of the gallium oxide substrate 12. Here, the polyorganosiloxane layer 14 and the resist resin layer 20 are removed by washing by using an organic solvent. By using an organic solvent, the polyorganosiloxane layer 14 and the resist resin layer 20 can be removed at the same time.

Figure 12:
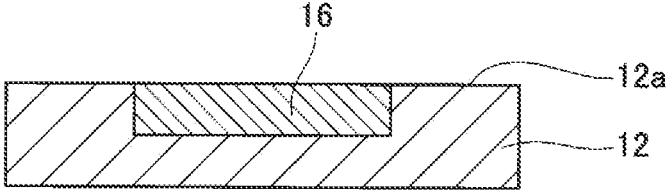
FIG. 12 is a view for explaining the manufacturing method of the second embodiment.

Next, the second heating step is performed. In the second heating step, the gallium oxide substrate 12 is heated to the temperature equal to or higher than the heat-resistance temperature of the polyorganosiloxane layer 14 and the heat-resistance temperature of the resist resin layer 20. Then, silicon in the silicon diffusion layer 16 diffuses in the gallium oxide substrate 12. As a result, as shown in FIG. 12, the thickness of the silicon diffusion layer 16 increases. Further, the silicon in the gallium oxide substrate 12 is activated, and the silicon diffusion layer 16 becomes an n-type region. After that, the semiconductor device is manufactured in the same manner as in the first embodiment.

As described above, in the method of the second embodiment, by using the resist resin layer 20 as a mask, the silicon diffusion layer 16 can be formed only on a part of the surface 12a of the gallium oxide substrate 12.

It is also possible to use a silicon oxide layer or the like as the mask. However, to form a mask with the silicon oxide layer, the following process is required. First, the silicon oxide layer is formed on the entire surface of the gallium oxide substrate. Next, a resist resin layer is formed on the entire surface of the silicon oxide layer. Next, photolithography is performed to define an opening in the resist resin layer. Next, a portion of the silicon oxide layer exposed through the opening of the resist resin layer is removed by etching to define an opening in the silicon oxide layer. Next, the resist resin layer is removed. By the above process, the mask of the silicon oxide layer is formed. In contrast, when the resist resin layer is used as a mask, the mask is formed only by forming the resist resin layer and defining an opening in the resist resin layer. That is, when the resist resin layer is used as a mask, time-consuming steps such as growth of the silicon oxide layer and etching of the silicon oxide layer are unnecessary. When the silicon oxide layer is used as a mask, it is necessary to etch the silicon oxide layer in removing the used mask (i.e., silicon oxide layer). On the other hand, when the resist resin layer 20 is used as the mask as in the second embodiment, when the used mask (i.e., the resist resin layer 20) is removed, the resist resin layer 20 can be removed together with the polyorganosiloxane layer 14 by using an organic solvent. In the method of the second embodiment, since the mask is not exposed to the high temperature, the resist resin layer 20 can be used for the mask. As a result, the process can be greatly simplified as compared with the case where the silicon oxide layer is used as a mask as described above.

The resist resin layer 20 may be cured in the first heating step of the second embodiment and it may become difficult to remove the resist resin layer 20 by using an organic solvent. In such case, the resist resin layer 20 may be removed together with the polyorganosiloxane layer 14 by ashing. Further, in the first and second embodiments described above, the gallium oxide substrate was used as the semiconductor substrate. However, any oxide semiconductor substrate other than the gallium oxide substrate may be used as the semiconductor substrate. By using the oxide semiconductor substrate, the same effects as in the first and second embodiments can be obtained.

Further, in the first and second embodiments described above, the polyorganosiloxane layer was used as a diffusion source of silicon. However, a siloxane other than polyorganosiloxane may be used as the diffusion source of silicon. Further, as the diffusion source of silicon, another organosilicon compound layer (e.g., any compound belonging to organosilane, siloxide, silyl hydride, silene, etc.) may be used. By using the organosilicon compound layer, the same effects as in the first and second embodiments can be obtained.

Further, in the first and second embodiments described above, the second heating step was performed. However, if the required thickness of the silicon diffusion layer is not so thick, it is not necessary to perform the second heating step.

The technical elements disclosed herein are listed below. The following technical elements are useful independently.

One example of the manufacturing method disclosed in the present specification may further include heating the oxide semiconductor substrate at a second temperature higher than the first temperature after removing the organosilicon compound layer.

According to this manufacturing method, by heating the oxide semiconductor substrate at the second temperature, the silicon in the silicon diffusion layer can diffuse in a wider range.

In one example of the manufacturing method disclosed in the present disclosure, the thickness of the silicon diffusion layer may be increased in heating the oxide semiconductor substrate at the second temperature.

According to this configuration, a thick silicon diffusion layer can be obtained.

In one example of the manufacturing method of the present specification, the second temperature may be higher than the heat-resistance temperature of the organosilicon compound layer.

The heat-resistance temperature of the organosilicon compound layer is the temperature determined by the manufacturer. Generally, the heat-resistance temperature of the organosilicon compound layer is the temperature at which the organosilicon compound is converted to lose its original characteristics. For example, the heat-resistance temperature may be the temperature at which the organosilicon compound layer is carbonized, or the temperature at which the organosilicon compound layer is oxidized.

As described above, by heating the oxide semiconductor substrate to the temperature exceeding the heat-resistance temperature of the organosilicon compound after removing the organosilicon compound layer, the silicon in the silicon diffusion layer can diffuse in a wider range.

In one example of the manufacturing method disclosed in the present specification, the organosilicon compound layer may be removed by using an organic solvent.

According to this configuration, the organosilicon compound layer can be removed from the oxide semiconductor substrate without eroding the oxide semiconductor substrate.

In one example of the manufacturing method disclosed in the present specification, the organosilicon compound layer may be made of an organosilicon compound containing oxygen.

According to this configuration, oxygen diffuses from the organosilicon compound layer into the oxide semiconductor substrate together with silicon. There are oxygen vacancies (a type of crystal defect) in the oxide semiconductor substrate. Since some of the oxygens having diffused from the organosilicon compound layer into the oxide semiconductor substrate enter the oxygen vacancies, the crystallinity of the silicon diffusion layer is improved. Therefore, it is possible to form the silicon diffusion layer having higher crystallinity.

One example of the manufacturing method disclosed in the present specification may further include forming a resist resin layer with an opening on the surface of the oxide semiconductor substrate. In forming the organosilicon compound layer, the organosilicon compound layer may be formed to be in contact with the surface of the oxide semiconductor substrate through the opening.

According to this configuration, the resist resin layer can be used as a mask to form the silicon diffusion layer in the range corresponding to the opening. By using the resist resin layer as a mask, the manufacturing process can be simplified as compared with the case where an oxide film or the like is used as a mask.

In one example of the manufacturing method disclosed in the present specification, the organosilicon compound layer may be made of siloxane.

According to this configuration, the silicon diffusion layer can be suitably formed.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A method for manufacturing a semiconductor device, the method comprising:
    forming an organosilicon compound layer on a surface of an oxide semiconductor substrate;
    heating the oxide semiconductor substrate provided with the organosilicon compound layer at a first temperature to form a silicon diffusion layer inside the oxide semiconductor substrate; and
    removing the organosilicon compound layer from the surface of the oxide semiconductor substrate after heating the oxide semiconductor substrate at the first temperature.

2. The method according to claim 1, further comprising heating the oxide semiconductor substrate at a second temperature that is higher than the first temperature after removing the organosilicon compound layer.

3. The method according to claim 2, wherein heating the oxide semiconductor substrate at the second temperature includes heating the oxide semiconductor substrate to increase a thickness of the silicon diffusion layer.

4. The method according to claim 2, wherein the second temperature is higher than a heat-resistance temperature of the organosilicon compound layer.

5. The method according to claim 1, wherein
removing the organosilicon compound layer includes
  removing the organosilicon compound layer by using
  an organic solvent.
6. The method according to claim 1, wherein
the organosilicon compound layer is made of an organo-
  silicon compound including oxygen.
7. The method according to claim 1, further comprising
forming a resist resin layer with an opening on the surface
  of the oxide semiconductor substrate, wherein
forming the organosilicon compound layer includes form-
  ing the organosilicon compound layer to be in contact
  with the surface of the oxide semiconductor substrate
  through the opening of the resist resin layer.
8. The method according to claim 1, wherein
the organosilicon compound layer is made of siloxane.

\* \* \* \* \*